United States Patent [19]

Miyamoto

[11] Patent Number: 4,658,159
[45] Date of Patent: Apr. 14, 1987

[54] SENSE AMPLIFIER CIRCUIT FOR SEMICONDUCTOR MEMORY DEVICE

[75] Inventor: Junichi Miyamoto, Yokohama, Japan

[73] Assignee: Kabushiki Kaisha Toshiba, Kawasaki, Japan

[21] Appl. No.: 850,082

[22] Filed: Apr. 9, 1986

Related U.S. Application Data

[63] Continuation of Ser. No. 523,764, Aug. 17, 1983, abandoned.

[30] Foreign Application Priority Data

Aug. 20, 1982 [JP] Japan .................................. 57-144235

[51] Int. Cl.[4] .......................... H03K 5/24; G11C 7/06
[52] U.S. Cl. .................................... 307/530; 307/355; 307/495; 330/300
[58] Field of Search .............. 307/530, 355, 356, 446, 307/494–496; 365/190, 196, 208; 330/253, 299, 300

[56] References Cited

U.S. PATENT DOCUMENTS

| | | | |
|---|---|---|---|
| 3,594,590 | 7/1971 | Smith | 307/530 |
| 3,745,539 | 7/1973 | Davidson et al. | 307/530 X |
| 3,760,194 | 9/1973 | Lutz et al. | 307/530 |
| 3,789,243 | 1/1974 | Donofrio et al. | 307/530 X |
| 4,027,176 | 5/1977 | Heuber et al. | 365/208 X |
| 4,032,801 | 6/1977 | Fulkerson | 307/355 X |
| 4,074,151 | 2/1978 | Buckley, III et al. | 307/471 X |
| 4,136,292 | 1/1979 | Suzuki et al. | 307/355 |
| 4,348,596 | 9/1982 | Atherton et al. | 307/530 X |
| 4,425,516 | 1/1984 | Wanlass | 307/570 X |
| 4,586,000 | 4/1986 | Wagner | 330/300 X |
| 4,590,438 | 5/1986 | Fukushima et al. | 330/300 |

OTHER PUBLICATIONS

Richman, *Characteristics and Operation of MOS Field-Effect Devices;* McGraw-Hill Co.; 1967; pp. 114–120.
Lane, "Bipolar FET High-Speed Logic Switch"; IBM Tech. Discl. Bull.; vol. 14, No. 12, pp. 3684–3685; 5/1972.
Camenzind, *Electronic Integrated Systems Design,* pp. 226–230; Van Nostrand Reinhold Co. (pub.)–1972.
Chan, "Bit-Select Sense Amplifier"; IBM Tech. Discl. Bull.; vol. 24, No. 11A, pp. 5654–5656; 4/1982.

*Primary Examiner*—Larry N. Anagnos
*Attorney, Agent, or Firm*—Oblon, Fisher, Spivak, McClelland & Maier

[57] ABSTRACT

A sense amplifier circuit for use in an MOS memory device, including bipolar sensing transistor, MOS load transistors connected to respective of the bipolar sensing transistors, and a constant current source, whereby high switching speed and high sensitivity are achieved.

5 Claims, 6 Drawing Figures

SENSE AMPLIFIER CIRCUIT FOR SEMICONDUCTOR MEMORY DEVICE

This application is a continuation of application Ser. No. 523,764, filed Aug. 17, 1983, abandoned.

BACKGROUND OF THE INVENTION

1. Field of the Invention

This invention relates to a semiconductor circuit and especially to a sense amplifier circuit provided for a semiconductor memory device having MOS (Metal Oxide Semiconductor) type transistor memory cells.

2. Description of the Prior Art

In the conventional semiconductor memory device, several types of sense amplifier circuits are employed. To obtain high speed and low power characteristics, CMOS (Complementary Metal Oxide Semiconductor) circuits are often used for the sense amplifier. A typical sense amplifier is disclosed in "ISSCC 1983 Digest of technical paper". This circuit consists of two single-ended active load differential amplifiers. Each amplifier includes two P-channel load transistors connected to a constant voltage supply and two N-channel sensing transistors connected between the load transistors and a ground voltage, respectively. The gate electrodes of the sensing transistors are connected to two bit lines, respectively. The bit lines are connected to a memory cell array. According to the information stored in the memory cells, the voltage balance of the two bit lines are changed. The sense amplifier detects and amplifies the change of the voltage balance.

In order to achieve a high switching speed, consideration must be given to the layout of the transistors. Generally the time t in which the change $\Delta V$ of the voltage balance of the two bit lines appears after the memory is accessed, has the following relation:

$$t \approx C_{BL} \cdot \Delta V / I$$

Here, $C_{BL}$ is the capacitance associated with the bit line and I is the current flowing through the bit line. Accordingly, the following approaches may be utilized to achieve the high speed response:

(1) Reducing the bit line capacitance $C_{BL}$,
(2) Reducing the voltage change $\Delta V$,
(3) Making the bit line current I larger.

It is, however, difficult to realize the first and third approaches. Namely, first of all, in order to achieve a higher cell packing density, which is another important requirement for a memory device, the channel width of the transistors of which the memory cells are constructed must be smaller. Therefore the bit line current may also be smaller. Next, as the number of cells connected to a bit line increases, the number of transfer gate transistors connected between the bit line and the memory cells, also increases. This increases the capacitance attached to the bit line.

Accordingly it is necessary to utilize the second approach to achieve a high speed response. However, it is also difficult to establish $\Delta V$ at a smaller level. It $\Delta V$ becomes smaller, the conductance of the sensing transistors must be larger and the channel width of the transistor must be larger. This is contrary to high packing density. Further, in case that $\Delta V$ is low, the distribution of Vth, the threshold voltage of the MOS sensing transistor, produced in the manufacturing process seriously affects the characteristics of the device.

There is another problem in the conventional device. Namely, the change of bit line voltage $\Delta V$ occurs near the supply voltage $V_{DD}$, but the most sensitive voltage range of the sense amplifier is near the threshold voltage Vth of the MOS sensing transistor. Generally Vth is so far from $V_{DD}$ that the sensing ability is not effectively used.

As mentioned above, it is very difficult to achieve a higher speed characteristic and a higher packing density at the same time by using a sense amplifier formed of MOS transistors. In order to overcome this problem, especially to achieve the higher speed characteristic, a bipolar transistor may be applied to the sense amplifier.

Referring to FIG. 1, we will explain a sense amplifier circuit including emitter coupled bipolar transistors used for a conventional ECL circuit. In this circuit, input signals $V_H$, $V_L$ are applied to the base electrodes of bipolar transistors 7, 8. The collector electrodes of the transistors 7, 8 are connected to a constant voltage supply $V_{DD}$ through resistors 9, 10 respectively and also connected to respective output terminals of this circuit. The emitter electrodes of transistors 7, 8 are connected to a constant current source formed of a bipolar transistor 11, resistor 12 and a control voltage supply $V_{CCB}$. In this circuit, the ratio $I_H$ to $I_L$, wherein $I_H$ is the current in the higher bit line and $I_L$ in the lower one, is as follows:

$$I_H/I_L \approx \exp\left(\frac{q}{KT} \cdot \Delta V\right).$$

Here, q is the elementary electric charge, K is the Boltzman constant and T is the temperature. In the case $KT/q=25$ mV, $\Delta V=0.4$ V, $I_H/I_L$ becomes $10^7$. Further, the difference of the lower output voltage $V_{OL}$ from the higher output voltage $V_{OH}$ is as follows:

$$V_{OH} - V_{OL} = R(I_H - I_L) \approx R I_H \approx RI$$

Namely, the bipolar transistor has a very high sensitivity because the collector current is very sensitive to the change of the bit line voltage. Further, the bipolar transistor also has the advantage of small Vth distribution produced in the manufacturing process.

However, the bipolar transistor in this circuit also has the following disadvantage to be overcome. That is, it needs elements other than the MOS circuit. Particularly, it needs an extra constant voltage source $V_{CCB}$ for controlling the constant current source. Further, the resistors 9,10 occupy a very large portion on the chip because the resistance must be large so as to obtain an efficient output voltage.

SUMMARY OF THE INVENTION

It is accordingly an object of this invention to provide a novel sense amplifier circuit for a semiconductor memory device with high speed and high packing density.

It is another object of this invention to provide a novel sense amplifier circuit for a semiconductor memory device with high sensitivity and a high input impedance characteristic.

Another object of this invention is to provide a novel sense amplifier circuit for a semiconductor memory device which overcomes the above-noted problems associated with bipolar transistors.

These and other objects are achieved according to the invention by providing a novel sense amplifier circuit for a semiconductor memory device, including a pair of bipolar transistors connected to a constant current source including a MOS transistor and a pair of load MOS transistors each connected to one of the bipolar transistors respectively, wherein an input signal is applied to the control electrode of the bipolar transistors, and an output signal is taken out from the connecting points of the bipolar transistors and the load MOS transistors. A particular feature of this invention is that a bipolar transistor is used to sense the voltage change of the bit line connected to MOS memory cells. This contributes to higher sensitivity and higher switching speed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
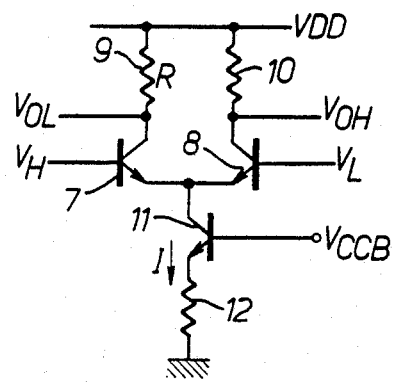
FIG. 1 is a circuit diagram of a conventional sense amplifier circuit.
Figure 2:
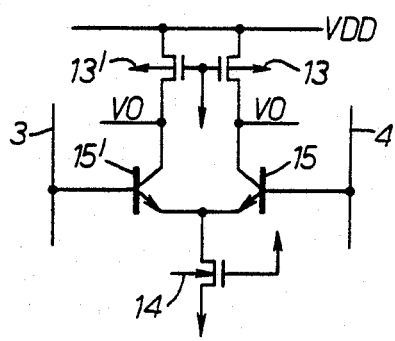
FIG. 2 is a circuit diagram of a first embodiment of a sense amplifier circuit of this invention.

Referring now to the drawings, wherein like reference numerals designate identical or corresponding parts throughout the several views, and more particularly to FIG. 2 thereof, we will explain a first embodiment of this invention. This sense amplifier includes a pair of NPN bipolar transistors 15, 15' whose base electrodes are connected to bit lines 3, 4 respectively, a pair of load P-channel MOS transistors 13, 13' connected between constant voltage source $V_{DD}$ and collector electrodes of the bipolar transistors 15, 15', and an N-channel MOS transistor 14 which is used as a constant current source and is connected between the emitter electrodes of the bipolar transistors 15, 15' and ground voltage.

One particular feature of this embodiment is that MOS transistors are used for load resistors and a constant current source. That is, this embodiment utilizes the characteristic that the MOS transistor has a high impedance but occupies a small portion on the chip.

In this embodiment, P-channel type MOS transistors are used for load transistors and N-channel type MOS transistors are used for the constant current source. However, in case PNP type bipolar transistors are used for sensing, the conductivity type of those MOS transistors may be opposite to this first embodiment. Further, $V_{DD}$ and the ground terminal may be exchanged.

In this circuit operation, it is necessary to operate the sensing bipolar transistors 15, 15' in the unsaturated region because the operation speed decreases extremely if operated in saturation. For this reason, the collector voltage must be established at a level not much lower than the base voltage. This relation is achieved by setting the Imax of the load MOS 13, 13' to be lower than that of the constant current source 14. This condition is formulated as follows, $$\beta_L(V_{GS,L}-V_{th,L})^2 >> \beta_C(V_{GS,C}-V_{th,C})^2.$$

Here, $\beta$ is a constant value depending on the structure of the transistors, $V_{GS}$ is gate-source voltage and $V_{th}$ is a threshold voltage. The suffixes L and C designate load transistor and constant current source, respectively. In case $V_{GS,L}=V_{GS,C}=V_{DD}$ and $V_{th,L}=V_{th,C}$, the condition becomes as follows, $$\beta_L >> \beta_C.$$

This equation means that the conductance of the load transistor 13, 13' must be much larger than that of the current source 14. However, it is necessary to take care of the fact that the output voltages from the collector of the bipolar transistors 15, 15' become lower level if the conductance of the current source 14 is established at an excessively small level.

Figure 3:
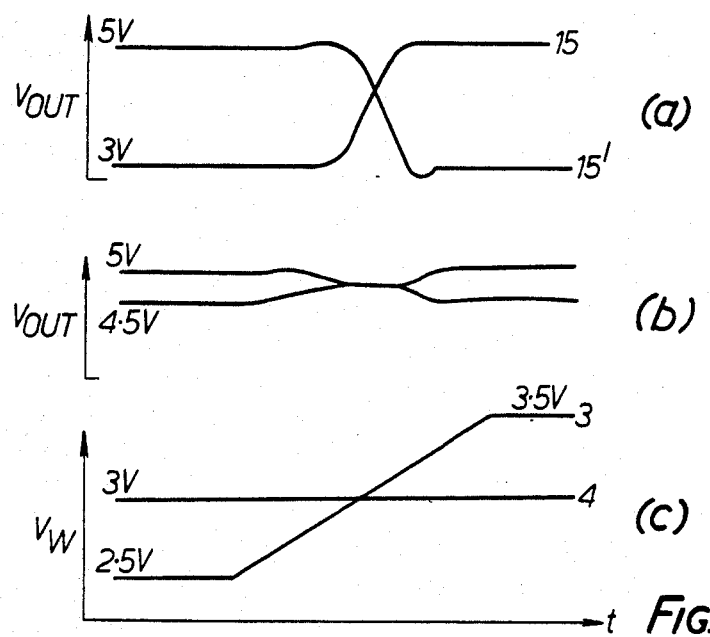
FIG. 3 is a graph illustrating input and output characteristics of the sense amplifier circuit of this invention.

FIGS. 3(a)~(c) show the input-output performance of this first embodiment. FIG. 3(a) shows the output signals of this invention. FIG. 3(b) shows the output signals of a conventional circuit. FIG. 3(c) shows the input signals or bit line voltages. Referring to FIG. 2 and FIGS. 3(a)~(c), we will explain the operation of this embodiment. At first, the bit line 3 is set up at a lower level and the bit line 4 at a higher level. In this case there is no collector current of the transistor 15'. On the other hand a certain collector current of the transistor 15 is flowing. Therefore the former output voltage is at a high level and the latter at a low level. After the memory cell connected to the bit line 3 is accessed and the charge stored in the cell is read out, the voltage of the bit line 3 becomes a higher level. Then the collector current of the transistor 15' begins to flow and that of the transistor 15 decreases. Finally the transistor 15' turns on and the transistor 15 turns off and the output voltages exchange their position. Comparing FIG. 3(a) with FIG. 3(c), it is clear that this embodiment achieves high switching speed and high amplification characteristics.

Figure 4:
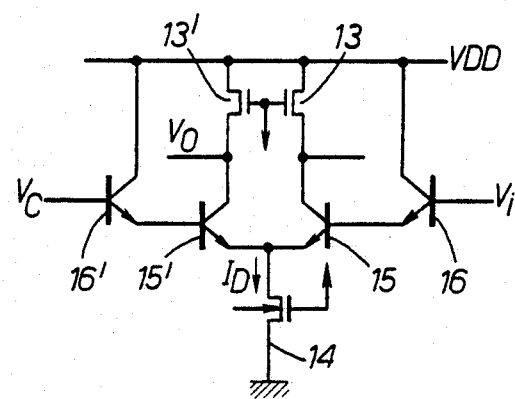
FIG. 4 is a circuit diagram of a second embodiment of this invention.

FIG. 4 shows a second embodiment of this invention. In this embodiment, a Darlington coupled circuit is provided in order to sense the bit line voltage balance. Namely, in this sense amplifier circuit, another pair of NPN bipolar transistors 16, 16' are added to the first embodiment shown in FIG. 2. The input signals from the bit lines are applied to the base electrodes of transistors 16, 16', whose emitter electrodes are connected to the base electrodes of the transistors 15, 15', respectively, and collector electrodes to the constant voltage supply $V_{DD}$. This embodiment has advantages due to the fact that it does not need so much base current and the input impedance is still a large value. Further, the output voltage can be set up at a higher level because the unsaturated region of the sensing transistor becomes substantially wide.

Figure 5:
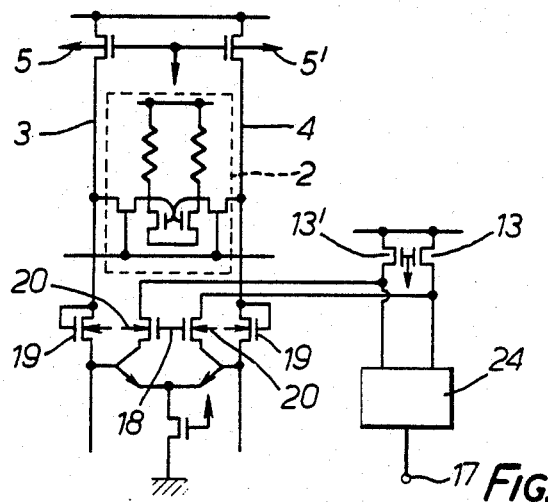
FIG. 5 is a circuit diagram of semiconductor memory device to which the sense amplifier circuit of this invention is applied.

FIG. 5 shows a SRAM circuit in which the first embodiment of this invention is utilized. In this circuit, P-channel MOS transistors, 5, 5' are coupled to the bit lines 3, 4 respectively. These transistors 5, 5' are used to precharge the bit lines 3, 4. The load MOS transistors 13, 13' are coupled to the collector electrodes of NPN transistors through transfer gate MOS transistor 20, which is controlled by a column decoding signal applied to the gate electrode 18. The memory cell 2 is connected to the bit lines 3, 4. The bit line has N-channel MOS transistor 19 in order to shift the voltage level of the bit line. By this transistor 19, the voltage level of the bit line is held at a relatively lower level than $V_{DD}$ so that a large difference between the output voltages of the sense amplifier can be obtained.

As a result, the number of main amplifiers and output driver 24 which amplify and drive the output signal to the terminal 17, can be reduced and the operation becomes faster.

Figure 6:
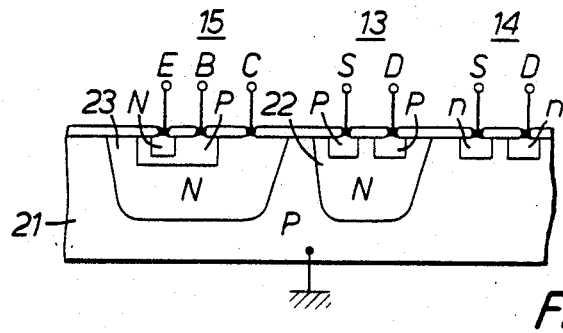
FIG. 6 is a cross-sectional view of a device according to this invention.

FIG. 6 is a cross-sectional view of a device including the main portion of the circuit shown in FIG. 2. This device includes a P type silicon substrate 21 in which a load transistor 13, a constant current source 14 and sensing transistor 15 are formed. The load transistor 13 includes N type well 22 and P type source or drain regions formed therein. The constant current source 14 includes N type source or drain regions formed in the substrate. The sensing transistor 15 includes N type well collector region, P type base region and N type emitter region. This structure can be formed by using a conventional C MOS fabrication process without any additional steps.

Obviously, numerous modifications and variations of the present invention are possible in light of the above teachings. It is therefore to be understood that within the scope of the appended claims, the invention may be practiced otherwise than as specifically described herein.

What is claimed is new and desired to be secured by Letters Patent of the United States:

1. A sense amplifier circuit comprising:
first and second sensing transistors each having a control electrode;
first and second load elements connected to respective ones of said first and second sensing transistors;
a constant voltage supply termined connected to said first and second load elements;
first and second input terminals coupled to respective ones of said control electrodes of said first and second sensing transistors;
first and second output terminals coupled to respective connecting points of said first and second sensing transistors and said load elements; and
a constant current supply connected between said first and second sensing transistors and a second constant voltage supply terminal;
wherein said sensing transistors are bipolar type transistors,
said load elements are MOS type transistors of a first channel type with the voltage applied between the gate and the source of said transistors being a constant value,
said constant current supply comprising a MOS type transistor of a complementary channel type, and
the conductance value of said load element is much larger than that of said constant current supply.

2. A sense amplifier circuit as recited in claim 1, wherein:
each said load element is a P channel MOS transistor,
said constant current supply comprises an N channel MOS transistor, and
each of said bipolar transistors is an NPN type bipolar transistor, having a base electrode connected to one of said input terminals, an emitter electrode connected to said constant current supply, and a collector electrode connected to a respective one of said output terminals.

3. A sense amplifier circuit as recited in claim 2, comprising:
third and fourth bipolar transistors, said first and second sensing transistors connected to said third and fourth bipolar transistors, respectively, so as to form respective Darlington connections, said third and fourth bipolar transistors connected to said first and second input terminals respectively.

4. A sense amplifier circuit as recited in claim 1, comprising:
third and fourth bipolar transistors, said first and second sensing transistors connected to said third and fourth bipolar transistors, respectively, so as to form respective Darlington connections, said third and fourth bipolar transistors connected to said first and second input terminals respectively.

5. A sense amplifier circuit device comprising:
a semiconductor substrate having one conductivity type;
a plurality of well regions of the other conductivity type formed in said substrate;
first and second bipolar type transistors each having a collector region which is one of said well regions, a base region of one conductivity type formed in said collector region and an emitter region of the other conductivity type formed in said base region;
first and second load elements each having a source and a drain region of one conductivity type formed in one of said well regions, said drain regions connected to respective ones of said collector regions;
a first constant voltage supply terminal coupled to the source regions of said first and second load elements;
first and second input terminals coupled to respective ones of said base regions;
first and second output terminals coupled to respective ones of said collector regions;
a constant current supply element having a source and a drain region of the other conductivity type formed in said substrate, the drain region of said constant current supply element coupled to said emitter regions; and
a second constant voltage supply terminal coupled to the source region of said constant current supply element;
wherein the conductance value of said load element is much larger than that of said constant current supply element.

* * * * *